(12) United States Patent
Chen et al.

(10) Patent No.: US 6,391,777 B1
(45) Date of Patent: May 21, 2002

(54) TWO-STAGE CU ANNEAL TO IMPROVE CU DAMASCENE PROCESS

(75) Inventors: Ying-Ho Chen, Taipei; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/846,481

(22) Filed: May 2, 2001

(51) Int. Cl.⁷ .............................................. H01L 21/44
(52) U.S. Cl. ...................................... 438/687; 438/678
(58) Field of Search ................................ 438/687, 678, 438/618–634

(56) References Cited

U.S. PATENT DOCUMENTS

| | | | | |
|---|---|---|---|---|
| 5,913,147 A | * | 6/1999 | Dubin et al. ................. | 438/687 |
| 6,090,710 A | | 7/2000 | Andricacos et al. ........ | 438/687 |
| 6,103,624 A | | 8/2000 | Nogami et al. ............. | 438/687 |
| 6,218,302 B1 | * | 4/2001 | Braeckelmann et al. .... | 438/687 |
| 6,221,765 B1 | * | 4/2001 | Ueno .......................... | 438/653 |

* cited by examiner

Primary Examiner—Jey Tsai
(74) Attorney, Agent, or Firm—George O. Saile; Stephen B. Ackerman; Sergin Oktay

(57) ABSTRACT

A method is disclosed to improve the reliability of copper damascene interconnects. This is accomplished by performing a two-stage anneal of the copper metal; first, after the deposition of copper in the damascene, and then for the second time, after the removal of excess copper by chemical mechanical polishing.

19 Claims, 6 Drawing Sheets

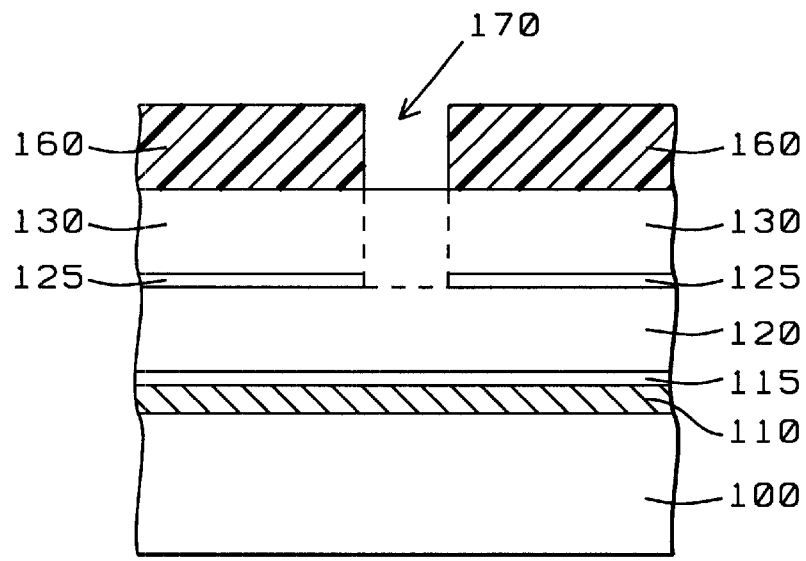
FIG. 1a – Prior Art
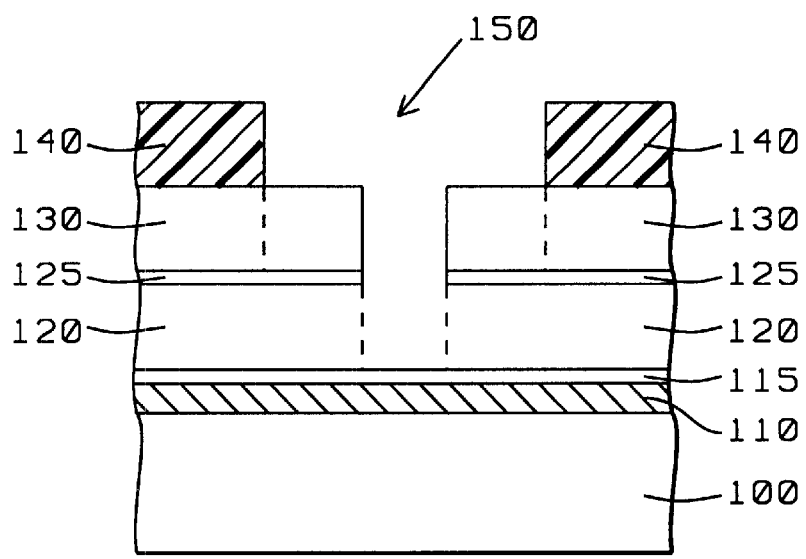
FIG. 1b – Prior Art

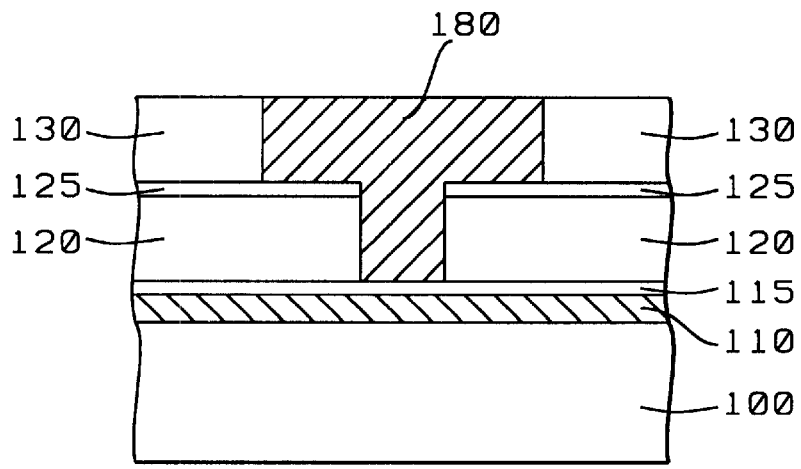
FIG. 1c – Prior Art
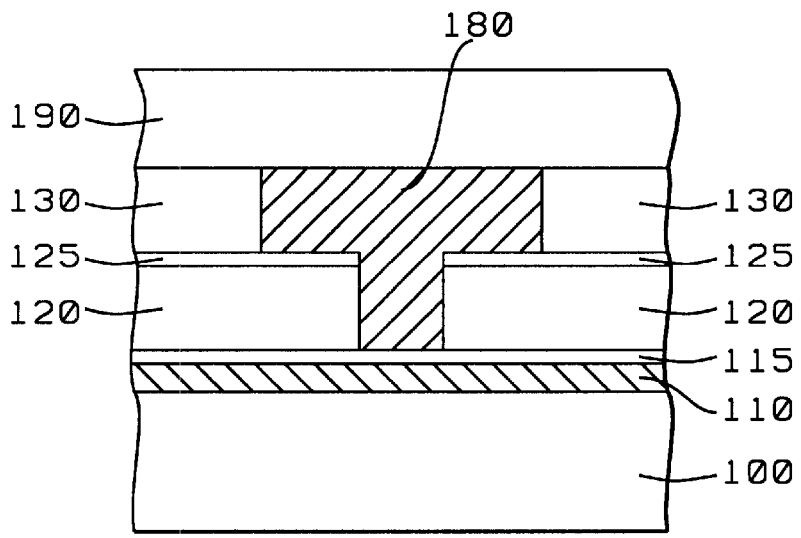
FIG. 1d – Prior Art

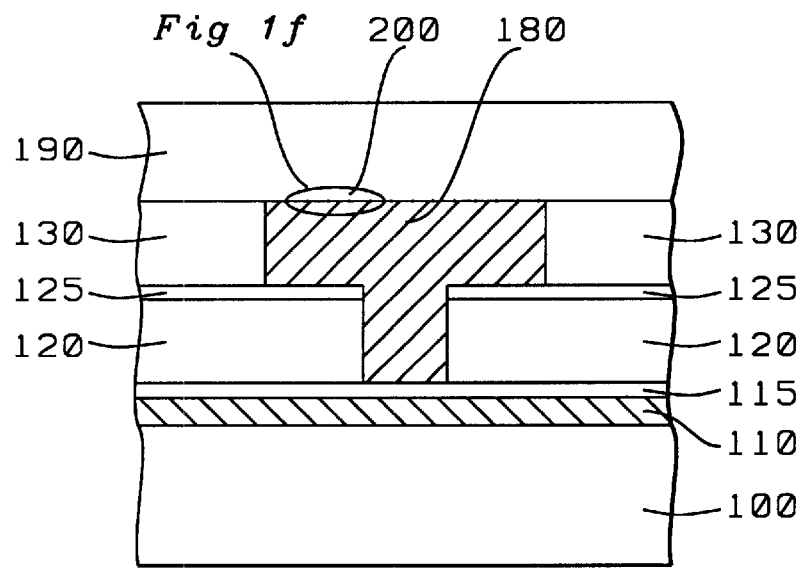
FIG. 1e – Prior Art
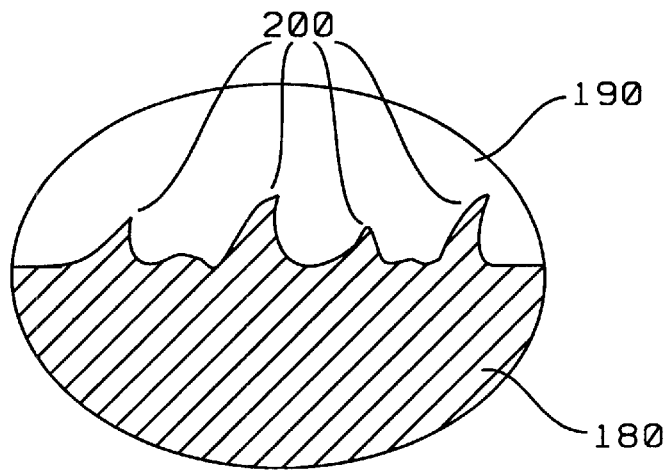
FIG. 1f – Prior Art

TWO-STAGE CU ANNEAL TO IMPROVE CU DAMASCENE PROCESS

BACKGROUND OF THE INVENTION (1) Field of the Invention

The present invention relates to the manufacture of integrated circuits in general, and in particular, to a two stage copper anneal process to suppress hillock formation in Cu dual damascene process used in manufacturing semiconductor products.

(2) Description of the Related Art

Copper is preferred in forming metal interconnects in ultra-large scale integrated (ULSI) semiconductor devices. This is because, as semiconductor device geometries continue to scale down below 0.25 $\mu$m, and approach 0.13 $\mu$m feature sizes, the metal interconnect lines which carry current between devices on a chip begin to dominate the overall circuit speed. In order to enhance interconnect speed and reliability, the semiconductor industry is moving away from blanket deposition and etch of aluminum (Al) based metallization towards single-damascene and dual-damascene interconnect structures with copper (Cu) based metallizations. Copper is a lower resistivity metal than aluminum, which results in lower RC interconnect delay. Copper has also been shown to have superior electromigration characteristics over aluminum, but is more difficult to process, primarily because it is more difficult to etch, and it acts as deep level trap in silicon (Si) based devices. The preferred way to process copper interconnects is to etch a line trench, via hole, or a contact hole into a dielectric material, deposit the interconnect metallization to fill the trench or hole, and then polish the metal back to remove any metal from the surface of the substrate or wafer. The resulting metal-filled trenches and holes form the electrical interconnect. Forming an interconnect structure by filling a trench or hole with metal is known as a damascene process. If a trench an underlying via hole are filled simultaneously, it is known as a dual-damascene process.

The process of forming conventional single or dual-damascene structures is shown in FIGS. 1a–1c. In one approach, two insulator layers (120) and (130) are formed on a substrate (100) with an intervening etch-stop layer (125), as shown in FIG. 1a. Substrate (100) is provided with metal layer (110) and a barrier layer (115). Using conventional photolithographic methods and photoresist (160), the upper insulator layer (130) is first etched, or patterned, with hole (170), as shown in FIG. 1a. The hole pattern is also formed into etch-stop layer (125). Then, the first photoresist mask is replaced with second mask (140) having a trench pattern, and the upper layer is etched to form trench (150) while at the same time the etching transfers the hole pattern in the etch-stop layer into lower insulation layer (120), as shown in FIG. 1b. It will be noted that the etch-stop layer stops the etching of the trench into the lower insulation layer. After the completion of the thusly formed dual damascene structure, both the hole opening and trench opening are filled with metal (180), and any excess material on the surface of the substrate is removed by chemical mechanical polishing, as seen in FIG. 1c.

Or, the order in which the trench and the hole are formed can be reversed (not shown). That is, using a first photoresist mask, a desired trench or trench pattern is first etched into the upper insulator material (130). The etching stops on etch-stop layer (125). Next, a second photoresist layer is formed over the substrate, thus filling the trench opening (150), and patterned with hole opening (170). The hole pattern is then etched into the lower insulator layer (120) and photoresist removed, thus forming the dual damascene structure shown in FIG. 1c. The process is repeated as many times as required to form the multi-level interconnections between metal lines and the holes formed therebetween. Contact holes are formed directly over the substrate where the metal in the hole contacts the surface of the substrate, while the via holes are formed between metal layers.

As desirable as the functional properties of copper are for forming interconnects, reliability of copper interconnects can be further improved. Nogami, et al., in U.S. Pat. No. 6,103,624 propose to increase the electromigration reliability to theoretically calculated levels. To accomplish this, a barrier metal layer is applied over the surface of a dielectric layer with a plurality of trenches. The barrier metal layer lines the trenches. A copper layer is placed over the barrier metal layer and fills the trenches. The part of the copper layer that is not inside the trenches is polished away. The copper layer is laser annealed to increase the grain size of copper, and provide a better interface bond between the barrier metal layer and the copper layer. The barrier metal layer protects the dielectric layer during the annealing process. That part of the barrier metal that is not in the trenches is removed by polishing. The larger grain size improves electromigration reliability of the device.

Another improvement to electromigration resistance is disclosed by Andricacos, et al., in U.S. Pat. No. 6,090,710 for copper alloys containing 0.01 and 10 weight percent of at least one alloying element selected from carbon, indium and tin. The copper alloy is annealed to cause the diffusion of the alloying element toward the grain boundaries between the grains in the alloy.

In addition to the electromigration problem addressed by prior art, the present invention addresses another reliability problem with copper interconnects, namely, hillock formation due to stresses built in copper as a result of the various process steps in forming semiconductor devices. The method involves a two-stage annealing process which is disclosed in the embodiments of the present invention.

Hillocks are spike-like projections that erupt in response to a state of compressive stress in metal films and consequently protrude from the film's surface, as shown in FIG. 1d. Thus, after a dual damascene interconnect such as (180) in FIG. 1c has been formed, another intermetal dielectric (IMD) layer (190) is formed over the substrate. However, because of almost ten times the difference in the thermal coefficient of expansion between dielectrics and metals −1.7×10$^{-6}$/° C. versus 17×10$^{-6}$/° C., respectively- metals, such as copper on a substrate, want to expand more than allowed by the substrate and dielectric expansion, but cannot, assuming the adhesion between the layers is adequate. As a result, compressive stresses build in the metal film. If they become too large (i.e., the process temperature exceeds ~300° C.), the stresses are relieved by the growth of hillocks at the film surface, as referenced by numeral (200) in FIGS. 1e and 1f. The judicious two-stage annealing of the copper that is disclosed in the present invention relieves the stresses and, therefore, prevents hillock formation, as described more in detail below in the embodiments of the invention.

SUMMARY OF THE INVENTION

It is therefore an object of the present invention to provide a method to suppress or avoid hillock formation in forming copper dual damascene structures.

It is another object of the present invention to provide a method of performing a two-stage copper annealing in order to prevent hillock formation.

It is an overall object of the present invention to provide a method of improving the reliability of copper dual damascene interconnects by suppressing the formation of hillocks.

These objects are accomplished by providing semiconductor substrate having a substructure comprising devices formed in said substrate and a metal layer formed thereon; forming an insulative dielectric layer over said substrate; forming a damascene structure within said insulative dielectric layer; forming a barrier layer in said damascene structure; forming a seed layer over said barrier layer; forming ECP copper over said seed layer in said damascene structure using electro-chemical plating (ECP); performing a first anneal of said copper; removing any excess copper layer from the surface said substrate; and performing a second anneal of said copper in said damascene structure.

BRIEF DESCRIPTION OF THE DRAWINGS

FIG. 1a is a cross-sectional view of a portion of a semiconductor substrate showing the forming of a hole opening in the upper insulative layer of a dual damascene structure, according to prior art.

FIG. 1b is a cross-sectional view of a portion of a semiconductor substrate showing the forming of a line trench in the upper insulative layer of a dual damascene structure, while at the same time transferring the hole pattern to the lower insulative layer, according to prior art.

FIG. 1c is a cross-sectional view of a portion of a semiconductor substrate showing the forming of metal in the dual damascene structure of FIG. 2b, according to prior art.

FIG. 1d is a cross-sectional view of a portion of a semiconductor substrate showing the forming of the next intermetal dielectric (IMD) layer to continue with the forming of the next damascene interconnect, according to prior art.

FIG. 1e is a cross-sectional view of a portion of a semiconductor substrate showing the forming of hillocks at the interface between copper damascene and the IMD layer of FIG. 1d, according to prior art.

FIG. 1f is a close-up view of the interface of FIG. 1e showing the spike-like hillock formations, according to prior art.

DESCRIPTION OF THE PREFERRED EMBODIMENTS

Referring now the drawings, in particular to FIGS. 2a–2f, there is shown a method of performing two-stage annealing of copper in order to prevent the formation of hillocks, and thereby improving the reliability of copper damascenes.

Figure 2A:
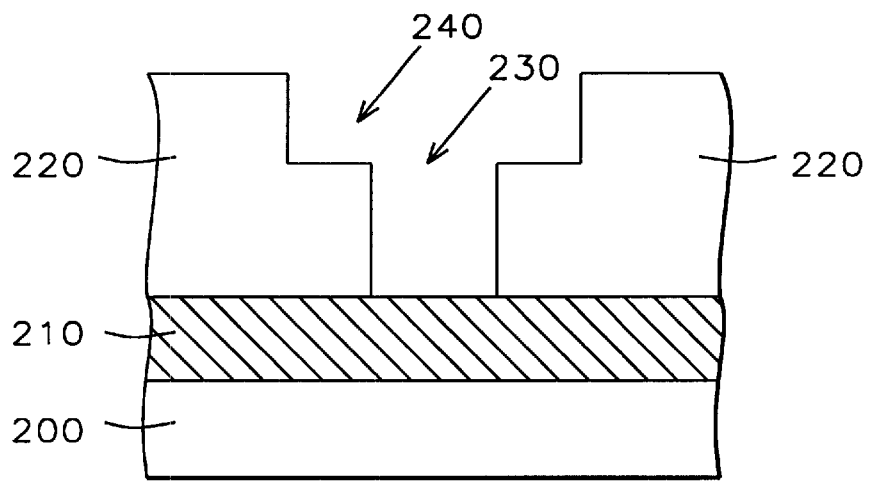
FIG. 2a is a cross-sectional view of a portion of a semiconductor substrate showing the forming of a dual damascene structure, according to the present invention.

FIG. 2a shows substrate (200), preferably silicon, having a substructure of devices (not shown) and metal layer (210) formed within and thereon. FIG. 2a shows further a dual damascene structure comprising hole opening (230) and line trench (240) formed in an insulative dielectric layer (220) on the same substrate.

Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket dielectric layer (220) is preferably formed of a dielectric material chosen from a group of dielectric materials having low dielectric constant with a thickness between about 3000 to 5000 Å.

Figure 2B:
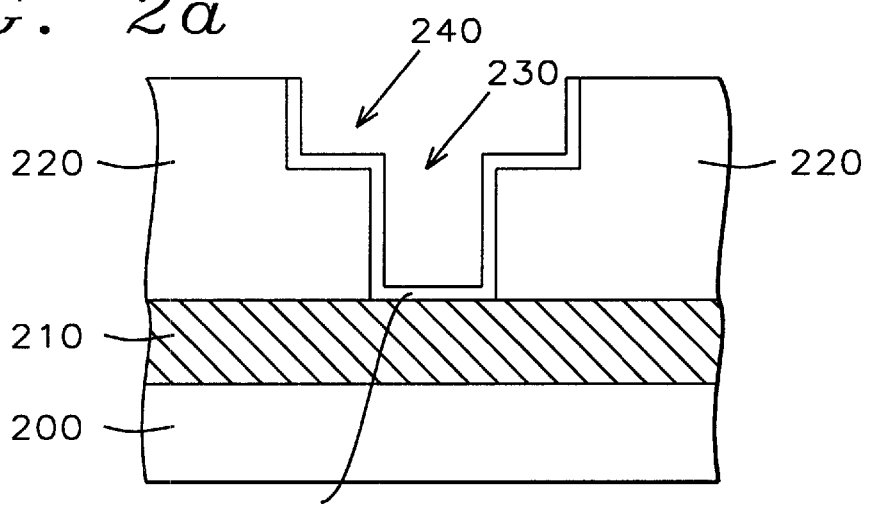
FIG. 2b is a cross-sectional view of a portion of a semiconductor substrate showing the forming of a barrier layer over the inside walls of the dual damascene structure of FIG. 2a, according to the present invention.

Next, diffusion barrier layer (250) is formed on the substrate including the inside walls of the dual damascene structure by using PVD or CVD methods as shown in FIG. 2b. It is important that this protective material be selected from a group of materials compatible with copper, that is, materials that will form a barrier to diffusion of copper into the dielectric layers surrounding the damascene structure. The barrier material is selected from a group consisting of titanium nitride, tungsten nitride, tungsten silicon nitride, tantalum silicon nitride, titanium silicon nitride or other ternary compound and the deposition is performed in an environment where the pressure is between about 0.1 to 10 mtorr, and temperature between about 100 to 600° C. It is preferred that diffusion barrier layer (250) has a thickness between about 150 to 450 Å.

Figure 2C:
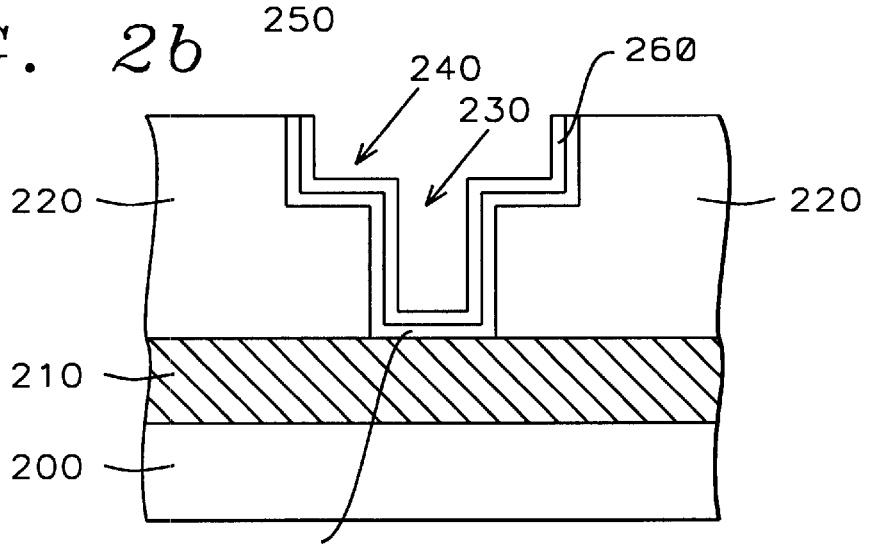
FIG. 2c is a cross-sectional view of a portion of a semiconductor substrate showing the forming of a seed layer over the barrier layer of FIG. 2b, according to the present invention.

The damascene structure of FIG. 2b is next lined with seed layer (260) shown in FIG. 2c prior to the deposition of metal to form the dual damascene interconnect. Seed layer provides nucleation sites for the metal that is to be electro-chemically deposited (ECP) next into the damascene structure. It is preferred that the thickness of seed layer (260) is between about 1000 to 2500 Å. It is common practice to increase the thickness of the seed layer so that there is still sufficient amount of seed layer left after the forming of natural cuprous oxide during processing.

Figure 2D:
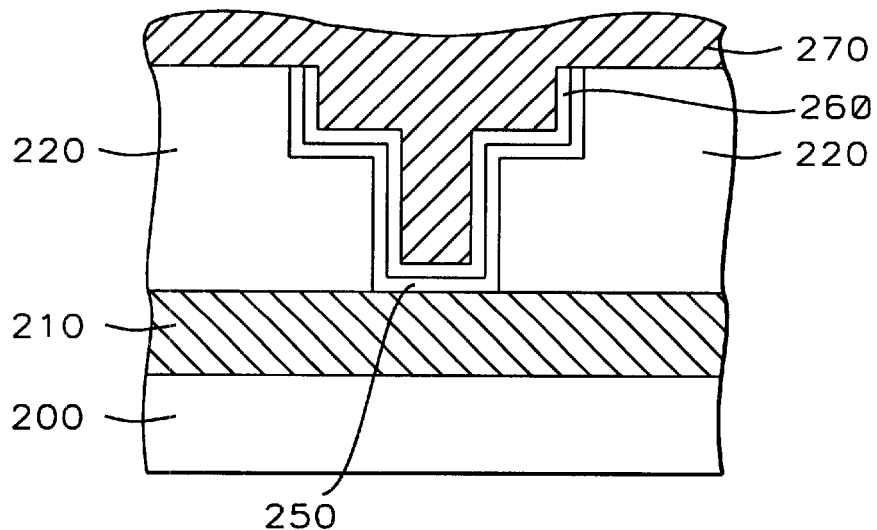
FIG. 2d is a cross-sectional view of a portion of a semiconductor substrate showing the electro-chemical plating (ECP) of copper into the dual damascene structure of FIG. 2c, and the first copper anneal, according to the present invention.
Figure 2E:
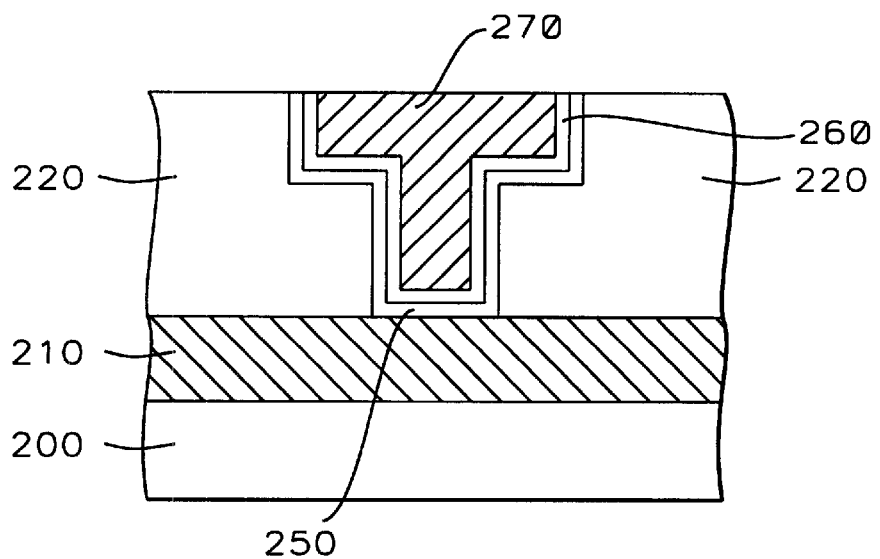
FIG. 2e is a cross-sectional view of a portion of a semiconductor substrate showing the completion of the ECP copper dual damascene interconnect of FIG. 2d after the removal of excess copper by chemical-mechanical polishing (CMP), and after the second copper anneal, according to the present invention.

Next, a layer of copper, layer (270) in FIG. 2d, is formed over the substrate including the damascene structure of the same Figure through the use of electro-chemical plating (ECP) process, which is known in the art. The preferred thickness of the ECP copper is between about 5000 to 15000 Å. At this stage, prior to the removal of the excess metal shown in FIG. 2d, it is important that the copper layer is subjected to a first anneal at a temperature between about 200 to 250° C. for a duration between about 1 to 2 minutes. This first anneal will relieve stresses formed during the deposition of the copper. Then, the excess metal is removed by chemical-mechanical polishing (CMP) technique, which is also known in the art. However, it is found in the present manufacturing line that the copper is once again stressed due to the CMP action. Therefore, if stresses are not relieved at this stage, which is the prior art practice, then hillocks will form when a dielectric layer is subsequently formed to continue with additional damascene interconnect layers. Thus, it is a main feature and key aspect of the present invention to perform a second anneal of the copper after CMP, and at a higher temperature than the first anneal. Preferably, the second anneal is performed at a temperature between about 350° C. to 450° C., in a nitrogen or nitrogen/hydrogen atmosphere for a duration between about 25 to 35 minutes. The resulting two-stage annealed dual damascene interconnect of the present invention is shown in FIG. 2e, where the first and second anneals are preformed before and after the CMP, respectively, and without any hillock formations. It is important that the second anneal is performed at a higher temperature than the first anneal.

Figure 2F:
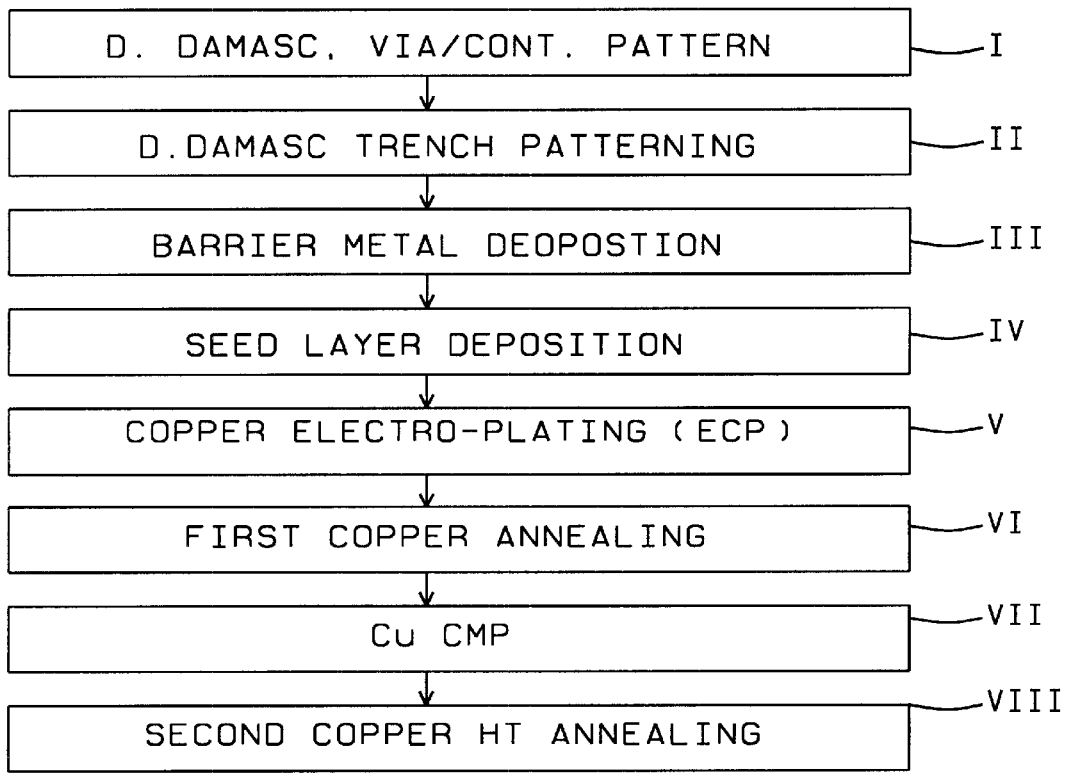
FIG. 2f is process flow diagram showing the various steps of forming an ECP copper dual damascene interconnect of the present invention with the key steps of performing two-stage copper anneal before and after CMP, according to the present invention.

The various steps of the invention are summarized in FIG. 2f. Process steps (I) and (II) relate to the forming of the hole opening and the trench, respectively. Process steps (III) and (IV), to the forming of the barrier and seed layers, respectively, while step (V) relate to the electro-chemical plating of copper into the dual damascene structure. A key aspect of the instant invention is shown in step (VI) where the copper layer is subjected to a first anneal. In step (VII), the substrate is subjected to CMP to remove excess copper from the surface of the substrate. Then, as a main feature of the invention, the substrate is subjected once more, that is, for the second time, to another annealing step; however, this time, at a higher temperature between about 350 to 450° C. This is shown in step (VIII) of FIG. 2f.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, for example, in forming single damascene, and other ULSI interconnects. Furthermore, the steps of forming the line trench and the via or contact hole in a dual damascene may be reversed.

While the invention has been particularly shown and described with reference to the preferred embodiments thereof, it will be understood by those skilled in the art that various changes in form and details may be made without departing from the spirit and scope of the invention.

What is claimed is:

1. A two-stage copper anneal process to improve copper damascene comprising the steps of:

providing a semiconductor substrate having a substructure comprising devices formed in said substrate and a metal layer formed thereon;

forming an insulative dielectric layer over said substrate;

forming a single damascene structure within said insulative dielectric layer;

forming a barrier layer in said single damascene structure;

forming a seed layer over said barrier layer;

forming ECP copper over said seed layer in said single damascene structure using electro-chemical plating (ECP);

performing a first anneal of said copper in air environment;

removing any excess copper layer from the surface said substrate; and performing a second anneal of said copper in said single damascene structure in a nitrogen/hydrogen environment at a temperature range substantially higher than that of the first anneal.

2. The method of claim 1, wherein said insulative dielectric layer comprises undoped or fluorine silicate glass (USG or FSG).

3. The method of claim 1, wherein said insulative dielectric layer has a thickness between about 2500 to 7000 Å.

4. The method of claim 1, wherein said barrier layer comprises tantalum nitride having a thickness between about 150 to 450 Å.

5. The method of claim 1, wherein said seed layer is a copper seed layer.

6. The method of claim 1, wherein said seed layer has a thickness between about 1000 to 2500 Å.

7. The method of claim 1, wherein said ECP copper has thickness between about 5000 to 15000 Å.

8. The method of claim 1, wherein said first anneal is accomplished at a temperature between about 200 to 250° C. for a duration between about 1 to 2 minutes.

9. The method of claim 1, wherein said removing said excess copper is accomplished by chemical-mechanical polishing (CMP).

10. The method of claim 1, wherein said second anneal is accomplished at a temperature between about 350 to 450° C. for a duration between about 25 to 35 minutes.

11. A two-stage copper anneal process to improve copper damascene comprising the steps of:

providing a semiconductor substrate having a substructure comprising devices formed in said substrate and a metal layer formed thereon;

forming an insulative dielectric layer over said substrate;

patterning and etching said insulative dielectric layer to form a dual damascene structure with inside walls therein;

forming a barrier layer over said substrate including over said inside walls of said dual damascene structure;

forming a seed layer over said barrier layer;

forming copper over said seed layer in said dual damascene structure using electro-chemical plating (ECP);

performing a first anneal of said copper in air environment;

removing any excess copper layer from the surface said substrate; and performing a second anneal of said copper in said single damascene structure in a nitrogen/hydrogen environment at a temperature range substantially higher than that of the first anneal.

12. The method of claim 11, wherein said insulative dielectric layer comprises undoped or fluorine silicate glass (USG or FSG).

13. The method of claim 11, wherein said insulative dielectric layer has a thickness between about 3000 to 5000 Å.

14. The method of claim 11, wherein said barrier layer comprises tantalum nitride having a thickness between about 150 to 450 Å.

15. The method of claim 11, wherein said seed layer comprises tantalum nitride having a thickness between about 1000 to 2500 Å.

16. The method of claim 11, wherein said ECP copper has thickness between about 5000 to 15000 Å.

17. The method of claim 11, wherein said first anneal is accomplished at a temperature between about 200 to 250° C. for a duration between about 1 to 2 minutes.

18. The method of claim 11, wherein said removing said excess copper is accomplished by chemical-mechanical polishing (CMP).

19. The method of claim 11, wherein said second anneal is accomplished at a temperature between about 350 to 450° C. for a duration between about 25 to 35 minutes.

* * * * *

UNITED STATES PATENT AND TRADEMARK OFFICE
CERTIFICATE OF CORRECTION

PATENT NO. : 6,391,777 B1
DATED : May 21, 2002
INVENTOR(S) : Ying-Ho Chen and Syun-Ming Jang It is certified that error appears in the above-identified patent and that said Letters Patent is hereby corrected as shown below:

<u>Title page,</u>
Item [74], please delete "Sergin Oktay", and replace it with -- Sevgin Oktay --.

Signed and Sealed this

Twenty-seventh Day of August, 2002

*Attest:*

*Attesting Officer*

JAMES E. ROGAN
*Director of the United States Patent and Trademark Office*